United States Patent
Wada et al.

(10) Patent No.: US 9,000,447 B2
(45) Date of Patent: Apr. 7, 2015

(54) SILICON CARBIDE SEMICONDUCTOR DEVICE

(75) Inventors: Keiji Wada, Osaka (JP); Takeyoshi Masuda, Osaka (JP); Toru Hiyoshi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/613,838

(22) Filed: Sep. 13, 2012

(65) Prior Publication Data

US 2013/0075759 A1 Mar. 28, 2013

Related U.S. Application Data

(60) Provisional application No. 61/539,215, filed on Sep. 26, 2011.

(30) Foreign Application Priority Data

Sep. 26, 2011 (JP) .................. 2011-208679

(51) Int. Cl.
*H01L 29/15* (2006.01)
*H01L 21/04* (2006.01)
(Continued)

(52) U.S. Cl.
CPC .......... *H01L 21/0475* (2013.01); *H01L 21/049* (2013.01); *H01L 29/66068* (2013.01);
(Continued)

(58) Field of Classification Search
CPC . H01L 21/0475; H01L 21/049; H01L 29/045; H01L 29/0623; H01L 29/1608; H01L 29/4236; H01L 29/66068; H01L 29/7813

USPC ........... 257/77, 335, 288, E29.084, E29.262; 438/268, 529, 270, 778
See application file for complete search history.

(56) References Cited

U.S. PATENT DOCUMENTS 5,744,826 A * 4/1998 Takeuchi et al. ................ 257/77
5,976,936 A 11/1999 Miyajima et al.
(Continued)

FOREIGN PATENT DOCUMENTS

CN 101542739 A 9/2009
EP 1612851 A1 1/2006
(Continued)

OTHER PUBLICATIONS

Epitaxial Devices—Characteristics—Electronic Circuits and Diagram-Electronics Projects and design, 2010, retrieved from circuitstoday.com/epitaxial-devices-characteristics.*
(Continued)

*Primary Examiner* — Brett Feeney
*Assistant Examiner* — Sophia Nguyen
(74) *Attorney, Agent, or Firm* — Venable LLP; Michael A. Sartori; Tamatane J. Aga

(57) ABSTRACT

A first layer has n type conductivity. A second layer is epitaxially formed on the first layer and having p type conductivity. A third layer is on the second layer and having n type conductivity. ND is defined to represent a concentration of a donor type impurity. NA is defined to represent a concentration of an acceptor type impurity. D1 is defined to represent a location in the first layer away from an interface between the first layer and the second layer in a depth direction. D1 in which $1 \leq ND/NA \leq 50$ is satisfied is within 1 μm therefrom. A gate trench is provided to extend through the third layer and the second layer to reach the first layer. A gate insulating film covers a side wall of the gate trench. A gate electrode is embedded in the gate trench with the gate insulating film interposed therebetween.

9 Claims, 5 Drawing Sheets

(51) Int. Cl.
*H01L 29/66* (2006.01)
*H01L 29/04* (2006.01)
*H01L 29/78* (2006.01)
*H01L 29/16* (2006.01)
*H01L 29/423* (2006.01)
*H01L 29/06* (2006.01)

(52) U.S. Cl.
CPC .......... *H01L29/045* (2013.01); *H01L 29/7813* (2013.01); *H01L 29/1608* (2013.01); *H01L 29/4236* (2013.01); *H01L 29/0623* (2013.01)

(56) References Cited

U.S. PATENT DOCUMENTS

| | | | |
|---|---|---|---|
| 6,020,600 A | 2/2000 | Miyajima et al. | |
| 6,133,587 A | 10/2000 | Takeuchi et al. | |
| 6,452,228 B1* | 9/2002 | Okuno et al. | 257/329 |
| 6,734,461 B1 | 5/2004 | Shiomi et al. | |
| 2003/0012925 A1 | 1/2003 | Gorrell | |
| 2003/0075765 A1* | 4/2003 | Ohnakado et al. | 257/393 |
| 2003/0137012 A1* | 7/2003 | Yamaguchi et al. | 257/368 |
| 2003/0227061 A1 | 12/2003 | Yokogawa et al. | |
| 2006/0214268 A1 | 9/2006 | Maeyama et al. | |
| 2006/0249073 A1 | 11/2006 | Asaoka et al. | |
| 2007/0026632 A1 | 2/2007 | Yamamoto | |
| 2007/0057262 A1 | 3/2007 | Nakamura et al. | |
| 2007/0090370 A1 | 4/2007 | Nakayama et al. | |
| 2007/0200116 A1 | 8/2007 | Harris et al. | |
| 2007/0210316 A1* | 9/2007 | Yonezawa et al. | 257/77 |
| 2007/0267663 A1 | 11/2007 | Harada | |
| 2008/0032880 A1 | 2/2008 | Maruyama et al. | |
| 2008/0213536 A1 | 9/2008 | Maruyama et al. | |
| 2008/0230787 A1* | 9/2008 | Suzuki et al. | 257/77 |
| 2009/0114982 A1 | 5/2009 | Saka et al. | |
| 2009/0200559 A1 | 8/2009 | Suzuki et al. | |
| 2010/0062582 A1 | 3/2010 | Fujikawa | |
| 2010/0261333 A1 | 10/2010 | Nakayama et al. | |
| 2010/0314626 A1 | 12/2010 | Harada et al. | |
| 2011/0121316 A1 | 5/2011 | Harada | |
| 2011/0175110 A1* | 7/2011 | Wada et al. | 257/77 |
| 2011/0201187 A1 | 8/2011 | Nishiwaki et al. | |
| 2011/0233560 A1* | 9/2011 | Koike et al. | 257/77 |
| 2012/0161154 A1 | 6/2012 | Mimura et al. | |
| 2012/0205670 A1 | 8/2012 | Kudou et al. | |
| 2012/0228640 A1 | 9/2012 | Masuda et al. | |
| 2012/0248461 A1 | 10/2012 | Masuda et al. | |
| 2012/0309195 A1 | 12/2012 | Masuda | |
| 2014/0203300 A1 | 7/2014 | Hatayama et al. | |

FOREIGN PATENT DOCUMENTS

| | | |
|---|---|---|
| JP | 07-326755 A | 12/1995 |
| JP | 08-070124 A | 3/1996 |
| JP | 9-074191 A | 3/1997 |
| JP | 9-199724 | 7/1997 |
| JP | 2000-021849 A | 1/2000 |
| JP | 2001-002499 A | 1/2001 |
| JP | 2001-503726 | 3/2001 |
| JP | 2004-292305 A | 10/2004 |
| JP | 2005-056868 | 3/2005 |
| JP | 2005-223255 A | 8/2005 |
| JP | 2005-294872 A | 10/2005 |
| JP | 2005-328013 A | 11/2005 |
| JP | 2005-340685 A | 12/2005 |
| JP | 2006-016288 A | 1/2006 |
| JP | 2006-228901 A | 8/2006 |
| JP | 2006-303469 A | 11/2006 |
| JP | 2007-035823 A | 2/2007 |
| JP | 2007-053227 A | 3/2007 |
| JP | 2007-080971 | 3/2007 |
| JP | 2007-165657 | 6/2007 |
| JP | 2007-182330 A | 7/2007 |
| JP | 2007-311627 A | 11/2007 |
| JP | 2008-135534 A | 6/2008 |
| JP | 2008-135653 | 6/2008 |
| JP | 2008-235546 A | 10/2008 |
| JP | 2009-523324 A | 6/2009 |
| JP | 2009-170456 A | 7/2009 |
| JP | 2009-289987 A | 12/2009 |
| JP | 2010-040564 | 2/2010 |
| JP | 2010-062381 A | 3/2010 |
| JP | 2010-103326 A | 5/2010 |
| JP | 2010-147222 A | 7/2010 |
| JP | 2011-044513 A | 3/2011 |
| WO | WO-98/21386 A1 | 5/1998 |
| WO | WO-02/097852 A2 | 12/2002 |
| WO | WO-2005/116307 A1 | 12/2005 |
| WO | WO-2007/081964 A2 | 7/2007 |
| WO | WO-2011/048800 A1 | 4/2011 |
| WO | WO-2012/017796 A1 | 2/2012 |
| WO | WO-2013/031172 A1 | 7/2013 |

OTHER PUBLICATIONS

A Primer on Photodiode Technology, retrieved from home.sandiego.edu/~ekim/photodiode/pdtech.html.*
Pn junction equlibrium graph, wikipedia.*
Office Action issued in U.S. Appl. No. 13/805,279 dated Mar. 24, 2014.
International Search Report and Written Opinion issued in PCT Patent Application No. PCT/JP2011/066096 dated Oct. 25, 2011.
Office Action issued in U.S. Appl. No. 13/579,815 dated Jun. 24, 2013.
Office Action issued in U.S. Appl. No. 13/579,815 dated Nov. 1, 2013.
Notice of Grounds of Rejection issued in Japanese Patent Application No. 2012-527720 dated Aug. 19, 2014.
International Search Report and Written Opinion issued in PCT Patent Application No. PCT/JP2011/067501 dated Nov. 8, 2011.
Office Action issued in U.S. Appl. No. 13/613,785 dated Dec. 6, 2013.
Yano et al., "SiO2/SiC Interface Properties on Various Surface Orientations," Mat. Res. Soc. Syrnp. Proc., vol. 742, pp. K4.5.1-K4.5.8.
International Search Report and Written Opinion issued in PCT Patent Application No. PCT/JP2012/070681 dated Nov. 20, 2012.
Office Action issued in U.S. Appl. No. 13/607,388 dated Dec. 24, 2013.
International Search Report and Written Opinion issued in PCT Patent Application No. PCT/JP2012/070658 dated Nov. 27, 2012.
International Search Report and Written Opinion issued in PCT Patent Application No. PCT/JP2012/069790 dated Sep. 18, 2012.
Office Action issued in U.S. Appl. No. 13/658,583 dated Mar. 29, 2013.
International Search Report and Written Opinion issued in PCT Patent Application No. PCT/JP2012/075516 dated Nov. 27, 2012.
Office Action issued in U.S. Appl. No. 13/613,785 dated Mar. 20, 2014.
Notice of Grounds of Rejection issued in Japanese Patent Application No. 2011-200247 dated Nov. 18, 2014.
Takenami et al., "Sloped Sidewalls in 4H-SiC Mesa Structure Formed by a Cl2-O2 Thermal Etching," Materials Science Forums, vol. 556-557 (2007) pp. 733-736.
Notification of First Office Action issued in Chinese Patent Application No. 201180018742.1 dated Oct. 15, 2014.
Notice of Grounds of Rejection issued in Japanese Patent Application No. 2011-208679 dated Jan. 6, 2015.
Notice of Grounds of Rejection issued in Japanese Patent Application No. 2011-253614 dated Jan. 13, 2015.
Hatayama et al., "Evaluation of Crystallinity in 4H-SiC{0001} Epilayers Thermally Etched by Chlorine and Oxygen System," Japanese Journal of Applied Physics, vol. 45, No. 27, 2006, pp. L690-L693.
Extended European Search Report issued in European Patent Application No. 11814584.6 dated Jan. 21, 2015.

* cited by examiner

SILICON CARBIDE SEMICONDUCTOR DEVICE

BACKGROUND OF THE INVENTION

1. Field of the Invention

The present invention relates to a silicon carbide semiconductor device, more particularly, a silicon carbide semiconductor device having a gate electrode.

2. Description of the Background Art

Japanese Patent Laying-Open No. 7-326755 discloses a trench gate type power MOSFET (Metal Oxide Semiconductor Field Effect Transistor). In this MOSFET, an n type epitaxial layer and a p type epitaxial layer are stacked in this order on an $n^+$ type single-crystal SiC substrate. In a predetermined region of a surface of the p type epitaxial layer, an $n^+$ source region is formed as a semiconductor region. Further, a trench is formed in a predetermined location of the surface of the p type epitaxial layer. This trench extends through the $n^+$ source region and the p type epitaxial layer to reach the n type epitaxial layer, has side surfaces perpendicular to the surface of the p type epitaxial layer, and has a bottom surface parallel to the surface of the p type epitaxial layer. As a method for forming the $n^+$ source region, an ion implantation method is disclosed which is performed onto the p type epitaxial layer using a mask material.

The above-described publication recites no detailed form of a boundary between the n type epitaxial layer and the p type epitaxial layer. Generally, when an n type epitaxial layer and a p type epitaxial layer are stacked in this order, a region having a donor type impurity and an acceptor type impurity mixed with each other and accordingly canceled by each other is formed in the vicinity of a boundary between the n type epitaxial layer and the p type epitaxial layer. The vicinity of the boundary is a region in which a depletion layer is to be formed due to pn junction. Hence, when a region having a low effective impurity concentration, i.e., a region in which a generation current is likely to be generated is formed to be thick in this region, a leakage current will be large due to the increase of the generation current.

Meanwhile, according to the above-described publication, the $n^+$ source region is formed by implanting ions into the upper portion of the p type epitaxial layer. Hence, after the implantation, lattice defects resulting from the ion implantation are generated in a portion of the p type epitaxial layer that faces the $n^+$ source region. In other words, lattice defects are increased in the depletion layer in the vicinity of the boundary between the p type epitaxial layer and the $n^+$ source region. This results in increased generation current in the depletion layer, which leads to a large leakage current.

Further, when forming the $n^+$ source region by means of the ion implantation, a certain amount of the donor type impurity for the formation thereof is also implanted into the portion of the p type epitaxial layer that faces the $n^+$ source region. With the cancelation by this donor type impurity, the effective density of the acceptor type impurity is decreased in the portion of the p type epitaxial layer that faces the $n^+$ source region. As a result, the region having a low effective impurity concentration, i.e., the region in which the generation current is likely to be generated is formed to be thick in the vicinity of the boundary between the p type epitaxial layer and the $n^+$ source region. Accordingly, the leakage current becomes large due to the generation current.

SUMMARY OF THE INVENTION

The present invention has been made to solve the foregoing problem, and has its object to provide a silicon carbide semiconductor device having a small leakage current.

A silicon carbide semiconductor device according to one aspect of the present invention includes a silicon carbide layer, a gate insulating film, and a gate electrode. The silicon carbide layer includes first to third layers. The first layer has n type conductivity. The second layer is epitaxially formed on the first layer and has p type conductivity. The third layer is provided on the second layer and has n type conductivity. ND is defined to represent a concentration of a donor type impurity in the silicon carbide layer, and NA is defined to represent a concentration of an acceptor type impurity in the silicon carbide layer. D1 is defined to represent a location in the first layer away from an interface between the first layer and the second layer in a depth direction. D1 in which $1 \leq ND/NA \leq 50$ is satisfied is within 1 μm therefrom. The silicon carbide layer is provided with a gate trench extending through the third layer and the second layer to reach the first layer. The gate insulating film covers a side wall of the gate trench. The gate electrode is embedded in the gate trench with the gate insulating film interposed therebetween.

According to the silicon carbide semiconductor device in the one aspect, D1 in which $1 \leq ND/NA \leq 50$ is satisfied is within 1 μm. Accordingly, a ratio of the donor type impurity concentration to the acceptor type impurity concentration is sufficiently steeply increased as the depth gets deeper from the boundary between the first and second layers into the first layer in the depth direction. Accordingly, a region having a low effective impurity concentration can be avoided from being formed to be thick in a portion of the first layer that faces the second layer. In other words, a region in which a generation current is likely to be generated can be avoided from being formed to be thick. In this way, a leakage current in the silicon carbide semiconductor device can be suppressed.

A silicon carbide semiconductor device according to another aspect of the present invention includes a silicon carbide layer, a gate insulating film, and a gate electrode. The silicon carbide layer includes first to third layers. The first layer has n type conductivity. The second layer is provided on the first layer and has p type conductivity. The third layer is epitaxially formed on the second layer and has n type conductivity. ND is defined to represent a concentration of a donor type impurity in the silicon carbide layer, and NA is defined to represent a concentration of an acceptor type impurity in the silicon carbide layer. D2 is defined to represent a location in the second layer away from an interface between the second layer and the third layer in a depth direction. D2 in which $1 \leq NA/ND \leq 100$ is satisfied is within 1 μm therefrom. The silicon carbide layer is provided with a gate trench extending through the third layer and the second layer to reach the first layer. The gate insulating film covers a side wall of the gate trench. The gate electrode is embedded in the gate trench with the gate insulating film interposed therebetween.

According to the silicon carbide semiconductor device in the another aspect, the third layer having n type conductivity is epitaxially formed. Hence, no ion implantation for providing the third layer with n type conductivity needs to be performed. Accordingly, lattice defects otherwise resulting from the ion implantation can be avoided from being formed in the portion of the second layer that faces the third layer. In this way, a generation current resulting from the lattice defects are restrained in the depletion layer in the vicinity of the boundary between the second and third layers. In this way, a leakage current in the silicon carbide semiconductor device can be suppressed.

Further, D2 in which $1 \leq NA/ND \leq 100$ is satisfied is within 1 μm. Accordingly, a ratio of the acceptor type impurity concentration to the donor type impurity concentration is sufficiently steeply increased as the depth gets deeper from the boundary between the second and third layers into the second layer in the depth direction. Accordingly, a region having a low effective impurity concentration can be avoided from being formed to be thick in a portion of the second layer that faces the third layer. In other words, a region in which a generation current is likely to be generated can be avoided from being formed to be thick. In this way, a leakage current in the silicon carbide semiconductor device can be suppressed.

A silicon carbide semiconductor device according to still another aspect of the present invention includes a silicon carbide layer, a gate insulating film, and a gate electrode. The silicon carbide layer includes first to third layers. The first layer has n type conductivity. The second layer is epitaxially formed on the first layer and has p type conductivity. The third layer is epitaxially formed on the second layer and has n type conductivity. ND is defined to represent a concentration of a donor type impurity in the silicon carbide layer, and NA is defined to represent a concentration of an acceptor type impurity in the silicon carbide layer. D1 is defined to represent a location in the first layer away from an interface between the first layer and the second layer in a depth direction. D1 in which $1 \leq ND/NA \leq 50$ is satisfied is within 1 μm therefrom. D2 is defined to represent a location in the second layer away from an interface between the second layer and the third layer in the depth direction. D2 in which $1 \leq NA/ND \leq 100$ is satisfied is within 1 μm therefrom. The silicon carbide layer is provided with a gate trench extending through the third layer and the second layer to reach the first layer. The gate insulating film covers a side wall of the gate trench. The gate electrode is embedded in the gate trench with the gate insulating film interposed therebetween.

According to the silicon carbide semiconductor device in the still another aspect, the third layer having n type conductivity is epitaxially formed. Hence, no ion implantation for providing the third layer with n type conductivity needs to be performed. Accordingly, lattice defects otherwise resulting from the ion implantation can be avoided from being formed in the portion of the second layer that faces the third layer. In this way, a generation current resulting from the lattice defects are restrained in the depletion layer in the vicinity of the boundary between the second and third layers. In this way, a leakage current in the silicon carbide semiconductor device can be suppressed.

Further, D1 in which $1 \leq ND/NA \leq 50$ is satisfied is within 1 μm. Accordingly, a ratio of the donor type impurity concentration to the acceptor type impurity concentration is sufficiently steeply increased as the depth gets deeper from the boundary between the first and second layers into the first layer in the depth direction. Accordingly, a region having a low effective impurity concentration can be avoided from being formed to be thick in a portion of the first layer that faces the second layer. In other words, a region in which a generation current is likely to be generated can be avoided from being formed to be thick. In this way, a leakage current in the silicon carbide semiconductor device can be suppressed.

Further, D2 in which $1 \leq NA/ND \leq 100$ is satisfied is within 1 μm. Accordingly, a ratio of the acceptor type impurity concentration to the donor type impurity concentration is sufficiently steeply increased as the depth gets deeper from the boundary between the second and third layers into the second layer in the depth direction. Accordingly, a region having a low effective impurity concentration can be avoided from being formed to be thick in a portion of the second layer that faces the third layer. In other words, a region in which a generation current is likely to be generated can be avoided from being formed to be thick. In this way, a leakage current in the silicon carbide semiconductor device can be suppressed.

It should be noted that the expression "layer epitaxially formed and having p type conductivity" is intended to indicate a layer in which the acceptor type impurity for providing p type conductivity is added simultaneously with the epitaxial growth. It should be also noted that the expression "layer epitaxially formed and having n type conductivity" is intended to indicate a layer in which the donor type impurity for providing n type conductivity is added simultaneously with the epitaxial growth.

Preferably, the side wall of the gate trench forms an angle of not less than 50° and not more than 70° relative to a main surface of the silicon carbide layer.

Preferably, the silicon carbide layer has one of a hexagonal crystal form and a cubic crystal form. When the silicon carbide layer has the hexagonal crystal form, the side wall of the gate trench substantially includes one of a {0-33-8} plane and a {0-11-4} plane. When the silicon carbide layer has the cubic crystal form, the side wall of the gate trench substantially includes a {100} plane.

According to the present invention, a silicon carbide semiconductor device having a small leakage current can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
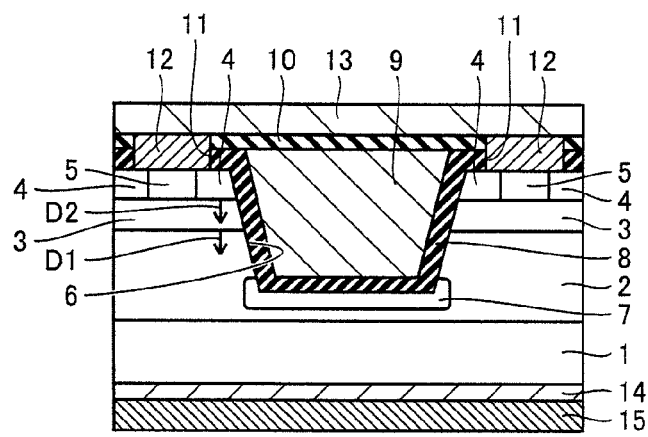
FIG. 1 is a schematic cross sectional view showing a silicon carbide semiconductor device in one embodiment of the present invention.

The following describes an embodiment of the present invention with reference to figures. It should be noted that in the below-mentioned figures, the same or corresponding portions are given the same reference characters and are not described repeatedly. Further, regarding crystallographic description in the present specification, an individual orientation is represented by [ ], a group orientation is represented by < >, and an individual plane is represented by ( ) and a group plane is represented by { }. In addition, a negative index is supposed to be crystallographically indicated by putting "-" (bar) above a numeral, but is indicated by putting the negative sign before the numeral in the present specification.

Referring to FIG. 1, a silicon carbide semiconductor device in the present embodiment is a vertical type MOSFET, which is a vertical type device employing a gate trench having inclined side walls. This semiconductor device includes: a substrate 1 having n type conductivity; and a silicon carbide layer epitaxially formed on a main surface (upper surface in the figure) of substrate 1.

Substrate 1 is made of silicon carbide of hexagonal crystal form or is made of silicon carbide of cubic crystal form. The main surface of substrate 1 preferably corresponds to the {000-1} plane or a plane inclined by several degrees relative to the {000-1} plane. More preferably, the main surface thereof corresponds to the (000-1) plane or a plane inclined by several degrees relative to the (000-1) plane.

Correspondingly, the silicon carbide layer epitaxially formed on substrate 1 is also made of silicon carbide of hexagonal crystal form or silicon carbide of cubic crystal form, and has a similar main surface. The silicon carbide layer includes: a breakdown voltage holding layer 2 (first layer) having n type conductivity; a p type body layer 3 (second layer) having p type conductivity; n type source contact layers 4 (third layer) having n type conductivity; and contact regions 5 having p type conductivity.

Breakdown voltage holding layer 2 is an n type layer epitaxially formed on one main surface of substrate 1. P type body layer 3 is a p type layer formed on breakdown voltage holding layer 2. Each of n type source contact layers 4 is an n type layer epitaxially formed on p type body layer 3. Contact regions 5 of p type are formed by means of ion implantation so as to be surrounded by n type source contact layers 4.

Further, this semiconductor device includes a gate insulating film 8, a gate electrode 9, an interlayer insulating film 10, source electrodes 12, a source wire electrode 13, a drain electrode 14, and a backside surface protecting electrode 15.

By removing portions of n type source contact layer 4, p type body layer 3, and breakdown voltage holding layer 2, a gate trench 6 is formed. In other words, the silicon carbide layer is provided with gate trench 6 extending through n type source contact layer 4 and p type body layer 3 to reach breakdown voltage holding layer 2. Gate trench 6 has side walls inclined relative to the main surface (upper surface in the figure) of substrate 1. In other words, the side walls of gate trench 6 are inclined relative to the main surface (upper surface in the figure) of the silicon carbide layer. Preferably, each of the side walls of gate trench 6 forms an angle of not less than 50° and not more than 70° relative to the main surface of the silicon carbide layer. Each of projection portions (upper portions of n type source contact layers 4 and contact regions 5) surrounded by the inclined side walls in the silicon carbide layer may have a hexagonal planar shape in the case where substrate 1 is of hexagonal crystal form, for example. Meanwhile, in the case where substrate 1 is of cubic crystal form, the projection portion may have a quadrangular planar shape, for example.

The inner walls of gate trench 6, i.e., the side walls and the bottom wall are covered with gate insulating film 8. Gate insulating film 8 extends onto the upper surface of each of n type source contact layers 4. Gate electrode 9 is embedded in gate trench 6 with this gate insulating film 8 interposed therebetween. Gate electrode 9 has an upper surface substantially as high as the upper surface of a portion of gate insulating film 8 on the upper surface of each of n type source contact layers 4.

Interlayer insulating film 10 is formed to cover gate electrode 9 as well as the portion of gate insulating film 8 on the upper surface of each of n type source contact layers 4. By removing portions of interlayer insulating film 10 and gate insulating film 8, openings 11 are formed to expose portions of n type source contact layers 4 and p type contact regions 5. Source electrodes 12 are formed in contact with p type contact regions 5 and the portions of n type source contact layers 4 so as to fill the inside of openings 11. Source wire electrode 13 is formed in contact with the upper surfaces of source electrodes 12 so as to extend on the upper surface of interlayer insulating film 10. Further, drain electrode 14 is formed on the backside surface of substrate 1 opposite to its main surface on which breakdown voltage holding layer 2 is formed. This drain electrode 14 is an ohmic electrode. Drain electrode 14 has a surface which is opposite to its surface facing substrate 1 and on which backside surface protecting electrode 15 is formed.

Figure 2:
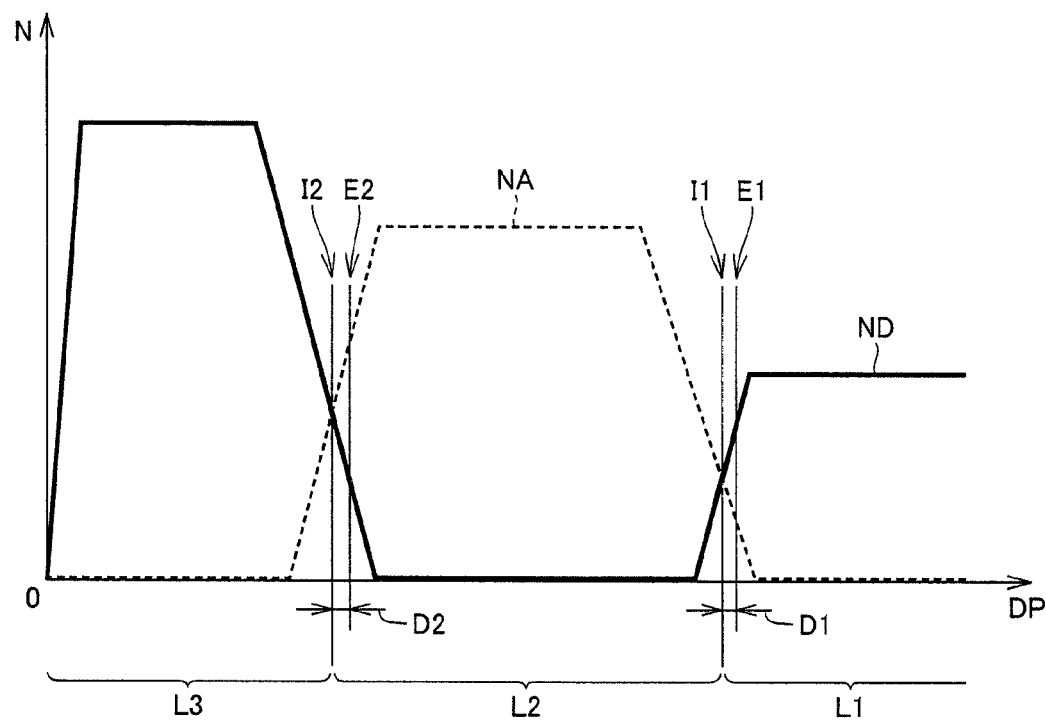
FIG. 2 is a graphical representation showing an exemplary impurity concentration profile of a silicon carbide layer provided in the silicon carbide semiconductor device shown in FIG. 1.

Referring to FIG. 2 next, the following describes an exemplary impurity concentration profile in the above-described silicon carbide layer. The vertical axis represents an impurity concentration N per unit volume. A solid line therein represents a concentration ND of a donor type impurity. A broken line therein represents a concentration NA of an acceptor type impurity. The horizontal axis represents a depth DP from the front-side surface (the upper surface of n type source contact layer 4 in the figure) of the silicon carbide layer. A region L3 corresponds to n type source contact layer 4 (third layer), a region L2 corresponds to p type body layer 3 (second layer), and a region L1 corresponds to breakdown voltage holding layer 2 (first layer).

Concentrations ND and NA are equal to each other at depth DP=I1, which corresponds to a boundary between regions L1 and L2 (interface between breakdown voltage holding layer 2 and p type body layer 3). In other words, ND/NA=1 is satisfied. As depth DP becomes deeper from depth I1, ND/NA is increased. When depth DP=E1, ND/NA reaches 50. Hence, assuming that a location in region L1 away from the boundary between regions L1 and L2 is D1 (an arrow in FIG. 1), location D1 in which 1≤ND/NA≤50 is satisfied is within a difference E1−I1. Difference E1−I1 is 1 μm or smaller, preferably, 0.2 μm or smaller.

With this configuration, ND/NA is sufficiently steeply increased as the depth gets deeper from depth I1 of the boundary between regions L1 and L2 (i.e., interface between breakdown voltage holding layer 2 and p type body layer 3) into region L1. Accordingly, a region having a low effective impurity concentration can be avoided from being formed to be thick in a portion of breakdown voltage holding layer 2 that faces p type body layer 3. In other words, a region in which a generation current is likely to be generated can be avoided from being formed to be thick. In this way, a leakage current in the silicon carbide semiconductor device can be suppressed.

Difference E1−I1 of 1 μm or smaller, preferably 0.2 μm or smaller, as described above can be achieved by epitaxially forming p type body layer 3 in region L2 under a sufficiently controlled condition. In this case, the acceptor type impurity for providing p type body layer 3 with p type conductivity is added during the epitaxial growth. Hence, no ion implantation for providing p type body layer 3 with p type conductivity needs to be performed. Accordingly, lattice defects otherwise resulting from the ion implantation can be avoided from being formed in the portion of breakdown voltage holding layer 2 that faces p type body layer 3. In this way, a generation current resulting from the lattice defects are restrained in the depletion layer in the vicinity of the boundary between breakdown voltage holding layer 2 and p type body layer 3. Accordingly, a leakage current in the silicon carbide semiconductor device can be suppressed.

Concentrations ND and NA are equal to each other at depth DP=I2, which corresponds to a boundary between regions L2 and L3 (interface between p type body layer 3 and n type source contact layer 4). In other words, NA/ND=1 is satisfied. As depth DP becomes deeper from depth I2, NA/ND is increased. When depth DP=E2, NA/ND reaches 100. Hence, assuming that a location in region L2 away from the boundary between regions L2 and L3 is D2 (see an arrow in FIG. 1), location D2 in which 1≤NA/ND≤100 is satisfied is within a difference E2−I2. Difference E2−I2 is 1 μm or smaller, preferably, 0.2 μm or smaller.

With this configuration, NA/ND is sufficiently steeply increased as the depth gets deeper from depth I2 of the boundary between regions L2 and L3 (i.e., interface between p type body layer 3 and n type source contact layer 4) into region L2. Accordingly, a region having a low effective impurity concentration can be avoided from being formed to be thick in a portion of p type body layer 3 that faces n type source contact layer 4. In other words, a region in which a generation current is likely to be generated can be avoided from being formed to be thick. In this way, a leakage current in the silicon carbide semiconductor device can be suppressed.

Difference E2−I2 of 1 μm or smaller, preferably 0.2 μm or smaller, as described above can be achieved by epitaxially forming n type source contact layer 4 in region L3 under a sufficiently controlled condition. In this case, the donor type impurity for providing n type source contact layer 4 with n type conductivity is added during the epitaxial growth. Hence, no ion implantation for providing n type source contact layer 4 with n type conductivity needs to be performed. Accordingly, lattice defects otherwise resulting from the ion implantation can be avoided from being formed in the portion of p type body layer 3 that faces n type source contact layer 4. In this way, a generation current resulting from the lattice defects are restrained in the depletion layer in the vicinity of the boundary between p type body layer 3 and n type source contact layer 4. In this way, a leakage current in the silicon carbide semiconductor device can be suppressed.

Further, in the semiconductor device shown in FIG. 1, each of the side walls of gate trench 6 is inclined and substantially corresponds to one of the {0-33-8} plane and the {0-11-4} plane in the case where the crystal form of silicon carbide constituting p type body layer 3 or the like is hexagonal. Further, in the case where the crystal form of silicon carbide constituting p type body layer 3 or the like is cubic, the inclined side wall of gate trench 6 corresponds to substantially the {100} plane. As seen from FIG. 1, each of the side walls corresponding to the so-called "semi-polar plane" can be used as a channel region, which is an active region of the semiconductor device. Because each of the side walls thus corresponds to the stable crystal plane, a leakage current can be reduced sufficiently and a higher breakdown voltage can be obtained in the case where such a side wall is employed for the channel region, as compared with a case where another crystal plane (such as the (0001) plane) is employed for the channel region.

The following briefly describes an operation of the semiconductor device. Referring to FIG. 1, when a voltage equal to or smaller than a threshold value is applied to gate electrode 9, i.e., when the semiconductor device is in an OFF state, p type body layer 3 and breakdown voltage holding layer 2 of n type conductivity are reverse-biased. Hence, it is in a non-conductive state. On the other hand, when gate electrode 9 is fed with a positive voltage, an inversion layer is formed in the channel region near a region of p type body layer 3 in contact with gate insulating film 8. Accordingly, n type source contact layer 4 and breakdown voltage holding layer 2 are electrically connected to each other. As a result, a current flows between source electrode 12 and drain electrode 14.

Referring to FIG. 3 to FIG. 13, the following describes a method for manufacturing the silicon carbide semiconductor device of FIG. 1 in the present embodiment.

Figure 3:
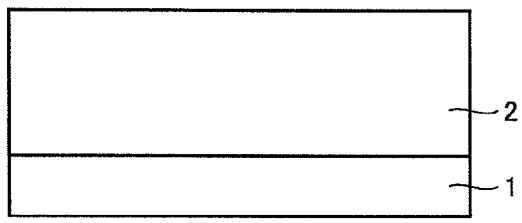
FIG. 3 is a schematic cross sectional view for illustrating a method for manufacturing the silicon carbide semiconductor device shown in FIG. 1.

First, referring to FIG. 3, on the main surface of substrate 1 made of silicon carbide, an epitaxial layer of silicon carbide with n type conductivity is formed. The epitaxial layer serves as breakdown voltage holding layer 2. Breakdown voltage holding layer 2 is formed by means of epitaxial growth employing a CVD (Chemical Vapor Deposition) method that utilizes a mixed gas of silane ($SiH_4$) and propane ($C_3H_8$) as a material gas and utilizes hydrogen gas ($H_2$) as a carrier gas, for example. In doing so, it is preferable to introduce nitrogen (N) or phosphorus (P) as an impurity of n type conductivity, for example. This breakdown voltage holding layer 2 contains the donor type impurity at a concentration of, for example, not less than $5 \times 10^{15}$ cm$^{-3}$ and not more than $5 \times 10^{16}$ cm$^{-3}$.

Figure 4:
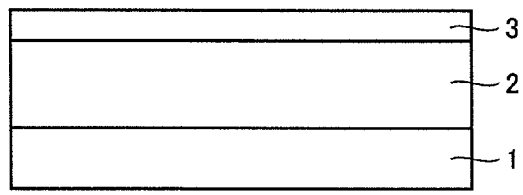
FIG. 4 is a schematic cross sectional view for illustrating the method for manufacturing the silicon carbide semiconductor device shown in FIG. 1.

Next, as shown in FIG. 4, an epitaxial layer of silicon carbide having p type conductivity is formed. The epitaxial layer serves as p type body layer 3. P type body layer 3 is formed by means of epitaxial growth employing the CVD method that utilizes a mixed gas of silane and propane as a material gas and utilizes hydrogen gas as a carrier gas, for example. In doing so, it is preferable to introduce aluminum (Al) as an impurity of p type conductivity, for example.

Figure 5:
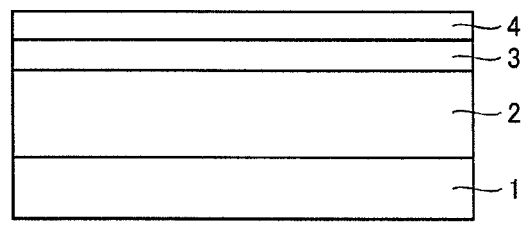
FIG. 5 is a schematic cross sectional view for illustrating the method for manufacturing the silicon carbide semiconductor device shown in FIG. 1.

Next, as shown in FIG. 5, an epitaxial layer of silicon carbide having n type conductivity is formed. A portion of the epitaxial layer serves as n type source contact layer 4. This epitaxial growth employs the CVD method that utilizes a mixed gas of silane and propane as a material gas and utilizes hydrogen gas as a carrier gas, for example. In doing so, it is preferable to introduce phosphorus as an impurity of n type conductivity, for example.

Figure 6:
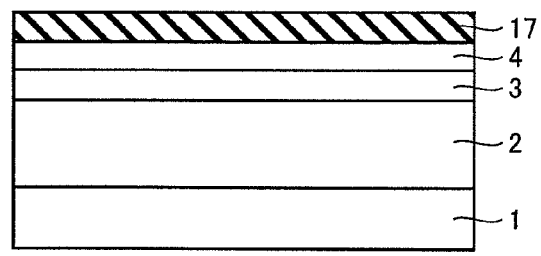
FIG. 6 is a schematic cross sectional view for illustrating the method for manufacturing the silicon carbide semiconductor device shown in FIG. 1.

Next, as shown in FIG. 6, on n type source contact layer 4, i.e., the main surface (upper surface in the figure) of the silicon carbide layer, a mask layer 17 is formed by means of a deposition method. Here, the deposition method refers to a method characterized in that all the materials for a film to be formed is externally supplied. Hence, the deposition method does not include a thermal oxidation method, i.e., a method that employs, as a part of the materials, an element having already existed in a region in which the film is to be formed. Examples of the deposition method usable include: the CVD method, the sputtering method, or the resistive heating deposition method. Preferably, the step of forming mask layer 17 is performed by depositing a material containing at least one of silicon oxide, silicon nitride, aluminum oxide, aluminum nitride, and gallium nitride.

Figure 7:
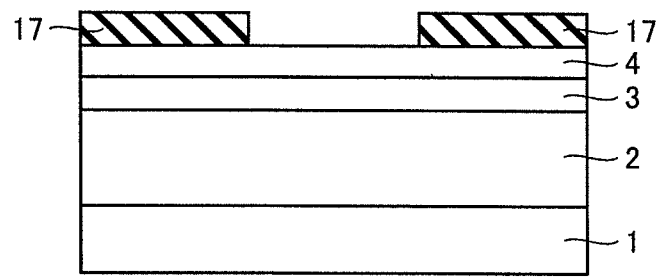
FIG. 7 is a schematic cross sectional view for illustrating the method for manufacturing the silicon carbide semiconductor device shown in FIG. 1.

Next, as shown in FIG. 7, mask layer 17 is patterned. Mask layer 17 can be patterned by means of, for example, a photolithography method. It should be noted that mask layer 17 has an opening pattern having a width of, for example, not less than 0.1 μm and not more than 2 μm.

Figure 8:
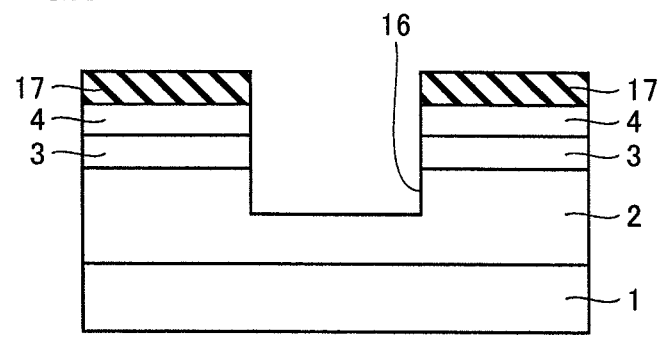
FIG. 8 is a schematic cross sectional view for illustrating the method for manufacturing the silicon carbide semiconductor device shown in FIG. 1.

Next, as shown in FIG. 8, using mask layer 17 as a mask, portions of n type source contact layer 4, p type body layer 3, and breakdown voltage holding layer 2 are removed by means of etching having a sputtering effect (physical etching effect). An exemplary, usable etching method is ion milling or reactive ion etching (RIE), in particular, inductively coupled plasma (ICP) RIE. Specifically, for example, ICP-RIE can be employed using $SF_6$ or a mixed gas of $SF_6$ and $O_2$ as a reaction gas. By means of such etching, a trench 16 having side walls each substantially perpendicular to the main surface of substrate 1 can be formed, before forming gate trench 6 shown in FIG. 1, in the region where gate trench 6 is to be formed.

Figure 9:
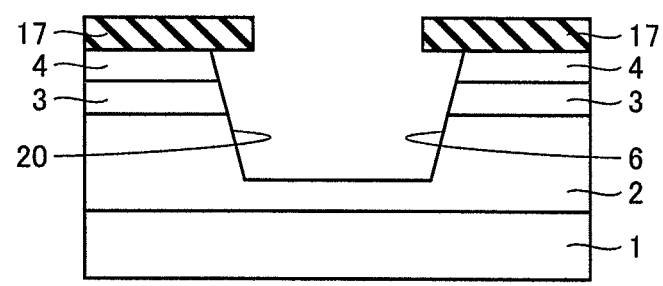
FIG. 9 is a schematic cross sectional view for illustrating the method for manufacturing the silicon carbide semiconductor device shown in FIG. 1.

Next, as shown in FIG. 9, thermal etching is performed. Specifically, the silicon carbide layer is heated while exposing the silicon carbide layer to a reaction gas. In this way, a predetermined crystal plane is exhibited in each of breakdown voltage holding layer 2, p type body layer 3, and n type source contact layer 4. In other words, the side walls of vertical trench 16 shown in FIG. 8 are thermally etched, thereby forming gate trench 6 having side walls 20 inclined relative to the main surface of substrate 1 as shown in FIG. 9.

In order to form the predetermined crystal plane, it is preferable to use a mixed gas of oxygen gas and chlorine gas as the reaction gas. In supplying the mixed gas, a ratio of a flow rate of oxygen to a flow rate of chlorine is preferably set at not less than 0.1 and not more than 2.0, more preferably, not less than 0.25. It should be noted that the reaction gas may contain a carrier gas in addition to the chlorine gas and the oxygen gas. An exemplary, usable carrier gas is nitrogen ($N_2$) gas, argon gas, helium gas, or the like.

Further, the heat treatment temperature in the thermal etching is preferably set at not less than 700° C. and not more than 1200° C. When the heat treatment temperature is not less than 700° C., an etching rate of approximately 70 μm/hr for SiC can be secured. The lower limit temperature thereof is more preferably 800° C. or greater, further preferably, 900° C. or greater. The upper limit temperature thereof is more preferably 1100° C. or smaller, further preferably, 1000° C. or smaller. In this case, when silicon oxide, silicon nitride, aluminum oxide, aluminum nitride, or gallium nitride is used as the material of mask layer 17, etching selectivity of SiC to the material of mask layer 17 can be made very large. Accordingly, mask layer 17 can be restrained from being worn during the etching of SiC.

It should be noted that the crystal plane exhibited at each of side walls 20 corresponds to the {0-33-8} plane, for example. Namely, in the etching under the above-described conditions, side wall 20 of gate trench 6 is spontaneously formed to correspond to the {0-33-8} plane, which is a crystal plane allowing for the slowest etching rate. As a result, a structure shown in FIG. 9 is obtained. It should be noted that the crystal plane constituting side wall 20 may be the {0-11-4} plane. Further, in the case where the crystal form of silicon carbide constituting breakdown voltage holding layer 2 or the like is cubic, the crystal plane constituting side wall 20 may correspond to the {100} plane. Preferably, as the {0-33-8} plane, the (0-33-8) plane is used. As the {0-11-4} plane, the (0-11-4) plane is used.

If a damaged layer exists in the side wall of vertical trench 16, the damaged layer can be removed by performing the thermal etching step for a sufficiently long time. In order to remove the damaged layer more securely, it is preferable to thermally etch the side wall of vertical trench 16 to a depth of 0.1 μm or greater.

Next, mask layer 17 is removed by means of an appropriate method such as etching. In this way, gate trench 6 is formed.

Figure 10:
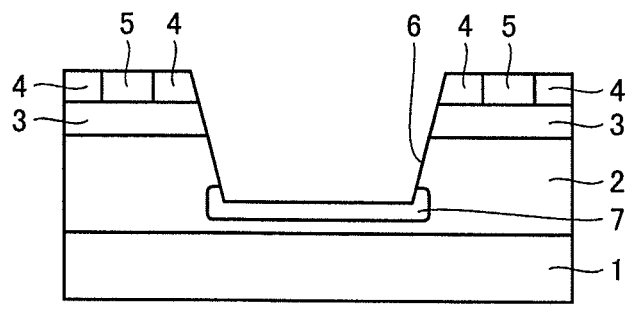
FIG. 10 is a schematic cross sectional view for illustrating the method for manufacturing the silicon carbide semiconductor device shown in FIG. 1.

Thereafter, an ion implantation mask (not shown) having a predetermined pattern, such as a $SiO_2$ film having a thickness of approximately 1 μm, is formed using the photolithography method and dry etching so as to extend from the inside of gate trench 6 onto each of the upper surfaces of n type source contact layers 4. As the ion implantation mask, there can be used a mask having an opening pattern in conformity with the bottom portion of gate trench 6 and portions of the upper surfaces of n type source contact layers 4. By implanting ions of an impurity of p type conductivity using this ion implantation mask as a mask, an electric field relaxing region 7 is formed at the bottom portion of gate trench 6 and contact region 5 of p type conductivity is formed at each of the regions of the portions of n type source contact layers 4. Thereafter, the ion implantation mask is removed. As a result, a structure shown in FIG. 10 is obtained.

Then, an activation annealing step is performed to activate the impurities implanted by means of the above-described ion implantation. In this activation annealing step, the annealing treatment is performed without forming any particular cap layer on the surface of the epitaxial layer made of silicon carbide. Here, the inventors have found that even when the activation annealing treatment is performed without forming a protective film such as the cap layer on the surface thereof in the case where the above-described {0-33-8} plane is employed, a property of the surface is never deteriorated and sufficient surface smoothness can be maintained. Thus, the conventionally required step of forming the protective film (cap layer) before the activation annealing treatment is omitted and the activation annealing step is directly performed. It should be noted that the above-described cap layer may be formed before performing the activation annealing step. Alternatively, for example, the cap layer may be provided only on the upper surfaces of n type source contact layer 4 and p type contact region 5 before performing the activation annealing treatment.

Figure 11:
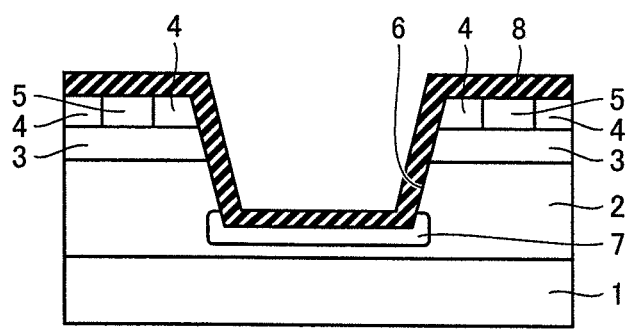
FIG. 11 is a schematic cross sectional view for illustrating the method for manufacturing the silicon carbide semiconductor device shown in FIG. 1.

Next, as shown in FIG. 11, gate insulating film 8 is formed to extend from the inside of gate trench 6 onto the upper surfaces of n type source contact layers 4 and p type contact regions 5. Accordingly, the gate insulating film is formed on the side walls of gate trench 6. As gate insulating film 8, for example, there can be used an oxide film (silicon oxide film) obtained by thermally oxidizing the epitaxial layer made of silicon carbide.

Figure 12:
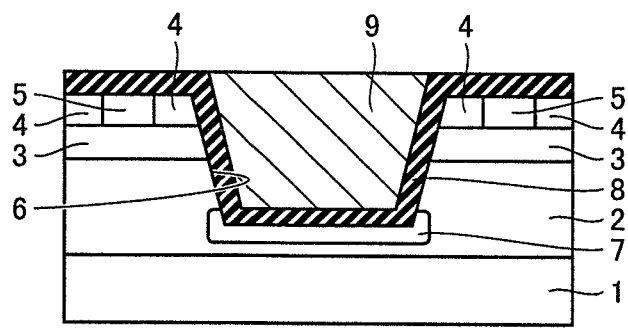
FIG. 12 is a schematic cross sectional view for illustrating the method for manufacturing the silicon carbide semiconductor device shown in FIG. 1.

Next, as shown in FIG. 12, gate electrode 9 is formed on gate insulating film 8 so as to fill the inside of gate trench 6. As a method for forming gate electrode 9, the following method can be used, for example. First, for example, a low-pressure CVD method is used to form a conductor film made of polysilicon having an impurity added therein. Thereafter, an appropriate method such as an etch back method or a CMP (Chemical Mechanical Polishing) method is used to remove a portion of the conductor film formed on regions other than the inside of gate trench 6. As a result, the conductor film filling the inside of gate trench 6 remains to constitute gate electrode 9.

Next, interlayer insulating film 10 (see FIG. 13) is formed to cover the upper surface of gate electrode 9 and the upper surface of gate insulating film 8 exposed on p type contact region 5. The interlayer insulating film can be made of any material as long as the material is insulative. Further, a resist film having a pattern is formed on interlayer insulating film 10, using the photolithography method. The resist film (not shown) is provided with an opening pattern formed in conformity with a region on p type contact region 5.

Using this resist film as a mask, portions of interlayer insulating film 10 and gate insulating film 8 are removed by means of etching. As a result, openings 11 (see FIG. 13) are formed to extend through interlayer insulating film 10 and gate insulating film 8. Each of openings 11 has a bottom portion at which p type contact region 5 and a portion of n type source contact layer 4 are exposed. Thereafter, a conductor film to serve as source electrode 12 (see FIG. 13) is formed to fill the inside of opening 11 and cover the upper surface of the above-described resist film. Thereafter, the resist film is removed using a chemical solution or the like, thereby simultaneously removing (lifting off) the portion of the conductor film formed on the resist film. As a result, the conductor film filling the inside of opening 11 constitutes source electrode 12. This source electrode 12 is an ohmic electrode making ohmic contact with p type contact region 5 and n type source contact layer 4.

Figure 13:
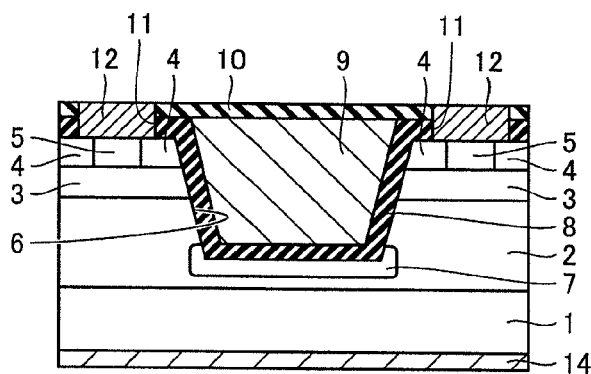
FIG. 13 is a schematic cross sectional view for illustrating the method for manufacturing the silicon carbide semiconductor device shown in FIG. 1.

Further, drain electrode 14 (see FIG. 13) is formed on the backside surface of substrate 1 (the surface thereof opposite to the main surface thereof on which breakdown voltage holding layer 2 is formed). Drain electrode 14 can be made of any material as long as the material allows for ohmic contact with substrate 1. In this way, a structure shown in FIG. 13 is obtained. Thereafter, heat treatment is performed to reduce a contact resistance and attain an excellent ohmic contact. For example, the heat treatment is performed in Ar atmosphere at 1000° C. for 5 minutes.

Thereafter, an appropriate method such as the sputtering method is employed to form source wire electrode 13 (see FIG. 1) and backside surface protecting electrode 15 (see FIG. 1). Source wire electrode 13 makes contact with the upper surface of source electrode 12, and extends on the upper surface of interlayer insulating film 10. Backside surface protecting electrode 15 is formed on the surface of drain electrode 14. As a result, the semiconductor device shown in FIG. 1 can be obtained.

Figure 14:
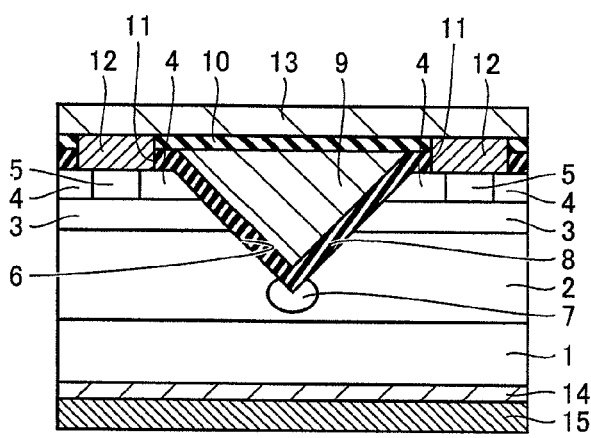
FIG. 14 is a schematic cross sectional view showing a variation of the silicon carbide semiconductor device shown in FIG. 1.

Next, referring to FIG. 14, a variation of the semiconductor device shown in FIG. 1 will be described. A semiconductor device shown in FIG. 14 basically has the same configuration as that of the semiconductor device shown in FIG. 1, but is different therefrom in terms of the shape of gate trench 6. Specifically, in the semiconductor device shown in FIG. 14, gate trench 6 has a V-shaped cross sectional shape. Further, from a different point of view, gate trench 6 of the semiconductor device shown in FIG. 14 has side walls inclined relative to the main surface of substrate 1, opposite to each other, and directly connected to each other at their lower portions. At the bottom portion of gate trench 6 (the portion at which the lower portions of the opposite side walls are connected to each other), electric field relaxing region 7 is formed.

With the semiconductor device thus configured, there can be provided the same effect as that of the semiconductor device shown in FIG. 1. Further, in the semiconductor device shown in FIG. 14, gate trench 6 does not have the flat bottom surface shown in FIG. 1. Accordingly, gate trench 6 shown in FIG. 14 has a width narrower than that of gate trench 6 shown in FIG. 1. As a result, the semiconductor device shown in FIG. 14 can be reduced in size as compared with the semiconductor device shown in FIG. 1. This is advantageous in attaining finer design and higher integration of the semiconductor device.

In the present specification, the case where each of side walls 20 of gate trench 6 corresponds to one of the {0-33-8} plane, the {0-11-4} plane, and the {100} plane encompasses a case where there are a plurality of crystal planes constituting the side wall of gate trench 6 and the plurality of crystal planes include one of the {0-33-8} plane, the {0-11-4} plane, and the {100} plane. The following specifically describes and illustrates the case where the side wall of gate trench 6 corresponds to the {0-33-8} plane.

Figure 15:
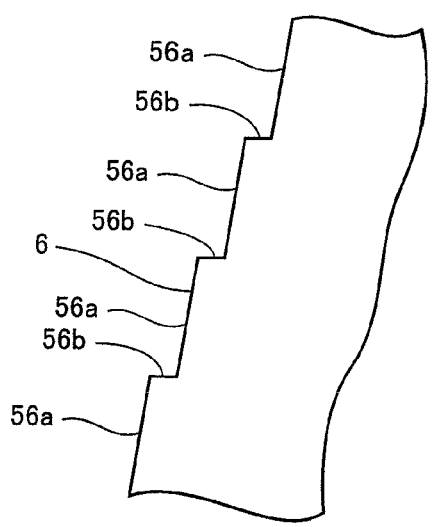
FIG. 15 is an enlarged schematic cross sectional view of a portion of a side wall of the silicon carbide layer.

Further, in the present invention, the {0-33-8} plane also includes a chemically stable plane constituted by, for example, alternately providing a plane 56a (first plane) and a plane 56b (second plane) in the side wall of gate trench 6 as shown in FIG. 15, microscopically. Plane 56a has a plane orientation of {0-33-8} whereas plane 56b, which is connected to plane 56a, has a plane orientation different from that of plane 56a. Here, the term "microscopically" refers to "minutely to such an extent that at least the size about twice as large as an interatomic spacing is considered". Preferably, plane 56b has a plane orientation of {0-11-1}. Further, plane 56b in FIG. 15 may have a length (width) twice as large as, for example, the interatomic spacing of Si atoms (or C atoms).

Further, in the case where the side wall of the trench corresponds to the {0-11-4} plane, the {0-11-4} plane in the present invention also includes a chemically stable plane constituted by alternately providing a plane 56a (first plane) and a plane 56b (second plane) as shown in FIG. 15, microscopically. Plane 56a has a plane orientation of {0-11-4} whereas plane 56b, which is connected to plane 56a, has a plane orientation different from that of plane 56a. Further, in the case where the side wall of the trench corresponds to the {100} plane, the {100} plane in the present invention also includes a chemically stable plane constituted by, for example, alternately providing a plane 56a (first plane) and a plane 56b (second plane) as shown in FIG. 15, microscopically. Plane 56a has a plane orientation of {100} whereas plane 56b, which is connected to plane 56a, has a plane orientation different from that of plane 56a.

Further, the side walls of gate trench 6 may include at least two planes of six-fold symmetry equivalent plane orientations in silicon carbide of hexagonal crystal form.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
   a silicon carbide layer including a first layer having n type conductivity, a second layer epitaxially formed on said first layer and having p type conductivity, and a third layer provided on said second layer and having n type conductivity, wherein ND is defined to represent a concentration of a donor type impurity in said silicon carbide layer, NA is defined to represent a concentration of an acceptor type impurity in said silicon carbide layer, and a value of ND/NA increases from 1 to 50 in a region in said first layer, said region is within 1 μm from an interface between said first layer and said second layer, said silicon carbide layer being provided with a gate trench extending through said third layer and said second layer to reach said first layer;

a gate insulating film covering a side wall of said gate trench; and a gate electrode embedded in said gate trench with said gate insulating film interposed therebetween.

2. The silicon carbide semiconductor device according to claim 1, wherein said side wall of said gate trench forms an angle of not less than 50° and not more than 70° relative to a main surface of said silicon carbide layer.

3. The silicon carbide semiconductor device according to claim 1, wherein said silicon carbide layer has one of a hexagonal crystal form and a cubic crystal form, when said silicon carbide layer has the hexagonal crystal form, said side wall of said gate trench substantially includes one of a {0-33-8} plane and a {0-11-4} plane, and when said silicon carbide layer has the cubic crystal form, said side wall of said gate trench substantially includes a {100} plane.

4. A silicon carbide semiconductor device comprising:

a silicon carbide layer including a first layer having n type conductivity, a second layer provided on said first layer and having p type conductivity, and a third layer epitaxially formed on said second layer and having n type conductivity, wherein ND is defined to represent a concentration of a donor type impurity in said silicon carbide layer, NA is defined to represent a concentration of an acceptor type impurity in said silicon carbide layer, and a value of NA/ND increases from 1 to 100 in a region in said second layer, said region is within 1 μm from an interface between said second layer and said third layer, said silicon carbide layer being provided with a gate trench extending through said third layer and said second layer to reach said first layer;

a gate insulating film covering a side wall of said gate trench; and a gate electrode embedded in said gate trench with said gate insulating film interposed therebetween.

5. The silicon carbide semiconductor device according to claim 4, wherein said side wall of said gate trench forms an angle of not less than 50° and not more than 70° relative to a main surface of said silicon carbide layer.

6. The silicon carbide semiconductor device according to claim 4, wherein said silicon carbide layer has one of a hexagonal crystal form and a cubic crystal form, when said silicon carbide layer has the hexagonal crystal form, said side wall of said gate trench substantially includes one of a {0-33-8} plane and a {0-11-4} plane, and when said silicon carbide layer has the cubic crystal form, said side wall of said gate trench substantially includes a {100} plane.

7. A silicon carbide semiconductor device comprising:

a silicon carbide layer including a first layer having n type conductivity, a second layer epitaxially formed on said first layer and having p type conductivity, and a third layer epitaxially formed on said second layer and having n type conductivity, wherein ND is defined to represent a concentration of a donor type impurity in said silicon carbide layer, NA is defined to represent a concentration of an acceptor type impurity in said silicon carbide layer, a value of ND/NA increases from 1 to 50 in a region in said first layer, said region in said first layer is within 1 μm from an interface between said first layer and said second layer, and a value of NA/ND increases from 1 to 100 in a region in said second layer, said region in said second layer is within 1 μm from an interface between said second layer and said third layer, said silicon carbide layer being provided with a gate trench extending through said third layer and said second layer to reach said first layer;

a gate insulating film covering a side wall of said gate trench; and a gate electrode embedded in said gate trench with said gate insulating film interposed therebetween.

8. The silicon carbide semiconductor device according to claim 7, wherein said side wall of said gate trench forms an angle of not less than 50° and not more than 70° relative to a main surface of said silicon carbide layer.

9. The silicon carbide semiconductor device according to claim 7, wherein said silicon carbide layer has one of a hexagonal crystal form and a cubic crystal form, when said silicon carbide layer has the hexagonal crystal form, said side wall of said gate trench substantially includes one of a {0-33-8} plane and a {0-11-4} plane, and when said silicon carbide layer has the cubic crystal form, said side wall of said gate trench substantially includes a {100} plane.

* * * * *